(12) United States Patent
Yi

(10) Patent No.: US 6,356,502 B1
(45) Date of Patent: Mar. 12, 2002

(54) ADDRESS STROBE SIGNAL GENERATOR FOR MEMORY DEVICE

(75) Inventor: Seung-Hyun Yi, Ichon (KR)

(73) Assignee: Hyundai Electronics Industries Co., Ltd., Kyoundki-do (KR)

( * ) Notice: Subject to any disclaimer, the term of this patent is extended or adjusted under 35 U.S.C. 154(b) by 0 days.

(21) Appl. No.: 09/428,131

(22) Filed: Oct. 26, 1999

(30) Foreign Application Priority Data

Oct. 28, 1998 (KR) .............................................. 98-45294

(51) Int. Cl.$^7$ ................................................. G11C 8/00
(52) U.S. Cl. .......................... 365/230.06; 365/189.05; 365/230.08
(58) Field of Search ............................. 365/230.06, 194, 365/200, 230.08, 233.5, 230.05, 189.05

(56) References Cited

U.S. PATENT DOCUMENTS

| | | | |
|---|---|---|---|
| 4,905,201 A | 2/1990 | Ohira et al. ............ | 365/230.03 |
| 4,951,258 A | 8/1990 | Uehara ...................... | 365/222 |
| 5,546,352 A | * 8/1996 | Sato et al. .............. | 365/230.06 |
| 5,732,040 A | * 3/1998 | Yabe ...................... | 365/230.03 |
| 5,973,987 A | 10/1999 | Akai et al. ............. | 365/230.06 |
| 6,064,618 A | * 5/2000 | Kuriyama et al. ..... | 365/230.03 |

FOREIGN PATENT DOCUMENTS

| | | |
|---|---|---|
| EP | 0 135 940 | 3/1985 |
| EP | 0 180 895 | 5/1986 |
| EP | 0 553 547 | 8/1993 |
| KR | 1996-005293 | 3/2001 |

* cited by examiner

Primary Examiner—Richard Elms
Assistant Examiner—Hien Nguyen
(74) Attorney, Agent, or Firm—Townsend and Townsend and Crew LLP

(57) ABSTRACT

An apparatus and method for decoding address signals. The apparatus generally comprises an address buffer array, a buffer controller coupled to the address buffer array, an address decoder coupled to the address buffer array and a strobe generator coupled to the address decoder and the buffer controller. The address buffer array buffers address signals in response to an address strobe from the buffer controller. The strobe generator generates a decoding strobe in response to the address strobe. The decoding strobe signals the address decoder to decode the address signals received from the address buffer array. To synchronize the arrival of the decoding strobe and the buffered address signals at the decoder, the strobe generator has one or more signal transfer characteristics in common with one or more of the address buffers. In a specific embodiment, the strobe generator has a longer signal transfer delay than any address buffer in the address buffer array. Thus, the decoding strobe determines an input timing margin of the address decoder.

22 Claims, 6 Drawing Sheets

ADDRESS STROBE SIGNAL GENERATOR FOR MEMORY DEVICE

CROSS-REFERENCES TO RELATED APPLICATIONS

This application claims priority from a Korean Patent Application No. 1998-45294, filed Oct. 28, 1998, which is incorporated herein by reference in its entirety for all purposes.

BACKGROUND OF THE INVENTION

The present invention relates in general to semiconductor memories and in particular to optimizing address input timing in memory devices.

Memory circuits are made up of a large number of memory cells located at the intersection of word lines (or rows) and bit lines (or columns). The memory cells are typically arranged in separate arrays with separate row and column decoders that decode the address of a selected memory cell. FIG. 1 shows a simplified example of a prior art random access memory. In this typical prior art example, the memory arrays 100 are stacked on either sides of the global column decoder 102. Sense amplifiers 104 are disposed in between the memory arrays 100, and are typically shared by two adjacent memory arrays 100. Power is supplied to the sense amplifiers 104 by power buses 110 that branch off a wide metal bus extending from the power pad 112 down the side of the array. A row decoder 106 is disposed at the end of each memory array 100.

One common type of memory cell is the dynamic random access memory (DRAM). FIG. 2 shows a typical array of memory cells for a DRAM. Memory cell array 200 includes an access transistor 202 that connects a storage capacitor 204 to a bit line. A word line 206 within a given array connects to the gate terminals of access transistors of a plurality of memory cells 200. When a particular word line 206i is selected, all access transistors 202 connected to the word line turn on, allowing charge sharing to occur between the bit line parasitic capacitance 210 and the memory cell storage capacitor 204. A sense amplifier (not shown) detects the increase or decrease in bit line voltage from the memory cell and drives the complementary bit lines to full logic levels, e.g., $V_{SS}$ corresponding to a logical "0" and $V_{DD}$ corresponding to a logical "1", depending on the original voltage of stored in the memory cell. A selected column (i.e., bit line) decoder then connects a selected pair of bit lines to the I/O lines as described in connection with FIG. 1.

To select memory cells, row and column addresses are applied to the memory device, which buffers and decodes the addresses. FIG. 3 shows a typical prior art address decoding apparatus. The apparatus 300 generally contains a buffer array 320 having a plurality of address buffers $320_1$–$320_n$ coupled to an address decoder 340 and a buffer controller 310 coupled to the address buffers $320_1$–$320_n$ by a signal line 360. The address buffers $320_1$–$320_n$ receive address signals values via address lines 350. A buffer controller 310 generates an address strobe signal on line 360 that strobes the address into the address buffers $320_1$–$320_n$. Outputs of the buffers $320_1$–$320_n$ are then applied to an address decoder 340. Controlling the timing of the decode operation is critical since address decoder 340 must receive all outputs of buffers $320_1$–$320_n$ before it can validly decode the address signal. This is because, due to the varying distances between the outputs of buffers $320_1$–$320_n$ and the inputs of address decoder 340, the latched address signals at outputs of buffers 320 arrive at the inputs of decoder with different RC delays. Thus, address decoder 340 should not be enabled until the circuit ensures that all address signals have arrived at the inputs of decoder 340.

The prior art apparatus of FIG. 3 compensates for the varying RC delays by delaying an enable or strobe signal sent from the buffer controller to the address decoder, e.g. with a chain of inverters 370. The number and size of the inverters is carefully chosen so that the delay imposed by inverter chain 370 is long enough to ensure that enough time lapses before the output of the outermost buffer $320_1$ arrives at the input of decoder 340. That is, the decoder enable signal is a delayed version of the address strobe signal, wherein the delay is equal to the sum of RC delay of interconnect line 360, plus a delay through address buffer $320_1$, plus the RC delay through the longest interconnect line, plus a small margin. Consequently, in the prior art, the delay in the inverters is chosen to be equal to an upper limit of the known range of delays. In other words, inverter chain 370 was designed to apply a "worst case" delay to the address strobe sent to address decoder 340. The design for the worst case delay unnecessarily slows down the faster memory devices.

Thus, there is a need in the art for an address-decoding scheme that optimizes the speed of address decoding.

SUMMARY OF THE INVENTION

The disadvantages associated with the prior art are overcome by the present invention of an apparatus and method for decoding address signals.

The apparatus generally comprises an address buffer array, a first control signal generator coupled to the address buffer array, an address decoder coupled to the address buffer array and a second control signal generator coupled to the address decoder and the first control signal generator. The address buffer array buffers address signals in response to a first control signal from the first control signal generator. The second control signal generator generates a second control signal in response to the first control signal. The address decoder decodes the buffered address signals in response to the second control signal. To accurately time the arrival of the second control signal and the buffered address signals at the decoder, the second control signal generator has one or more signal transfer characteristics in common with one or more of the address buffers. In a specific embodiment, the second control signal generator has a longer signal transfer delay than any address buffer in the address buffer array. For example, the second control signal generator may be connected to the first control signal generator by a signal path that is longer than a longest signal path connecting one of the address buffers with the first control signal generator. The second control signal generator may comprise a circuit substantially equivalent to each address buffer in the address buffer array. Furthermore input and output lines connected to the circuit may be substantially equivalent to input and output lines connected to an outmost address buffer located adjacent to the second control signal generator.

The method for decoding address signals generally comprises buffering address signals in a buffer array in response to the first control signal. The second control signal generator generates the second control signal by delaying the first control signal using signal transferring characteristics of the buffer array. Thus, the second control signal determines an input timing margin of the address decoder. The address decoder then decodes the buffered address signals in response to the second control signal.

The present invention ensures that, for a given memory device, the delay in decoding the address closely matches inherent delays in the buffer array. Thus, memory devices having buffers with shorter than average inherent delays will not be slowed down unnecessarily.

DESCRIPTION OF THE SPECIFIC EMBODIMENTS

I. Introduction

Various embodiments of the present invention use a strobe generator to send a decoding strobe to an address decoder without introducing any unnecessary delays. The strobe generator is situated within a decoding apparatus such that it receives an address strobe from a buffer controller after all the address buffers have received the address strobe. In a preferred embodiment, this is accomplished by physically disposing the strobe generator circuitry next to the address buffer that is farthest away from the address decoder. The strobe generator is typically coupled to the end of an interconnect line that carries the address strobe from the buffer controller to the address buffers in the buffer array. To ensure a sufficient operating margin, the strobe generator has delay characteristics in common with the address buffers. The delay characteristics of the address buffers and the strobe generator can be closely matched by using substantially equivalent circuit designs for both the address buffers and the strobe generator.

II. Exemplary Decoding Apparatus

Figure 1:
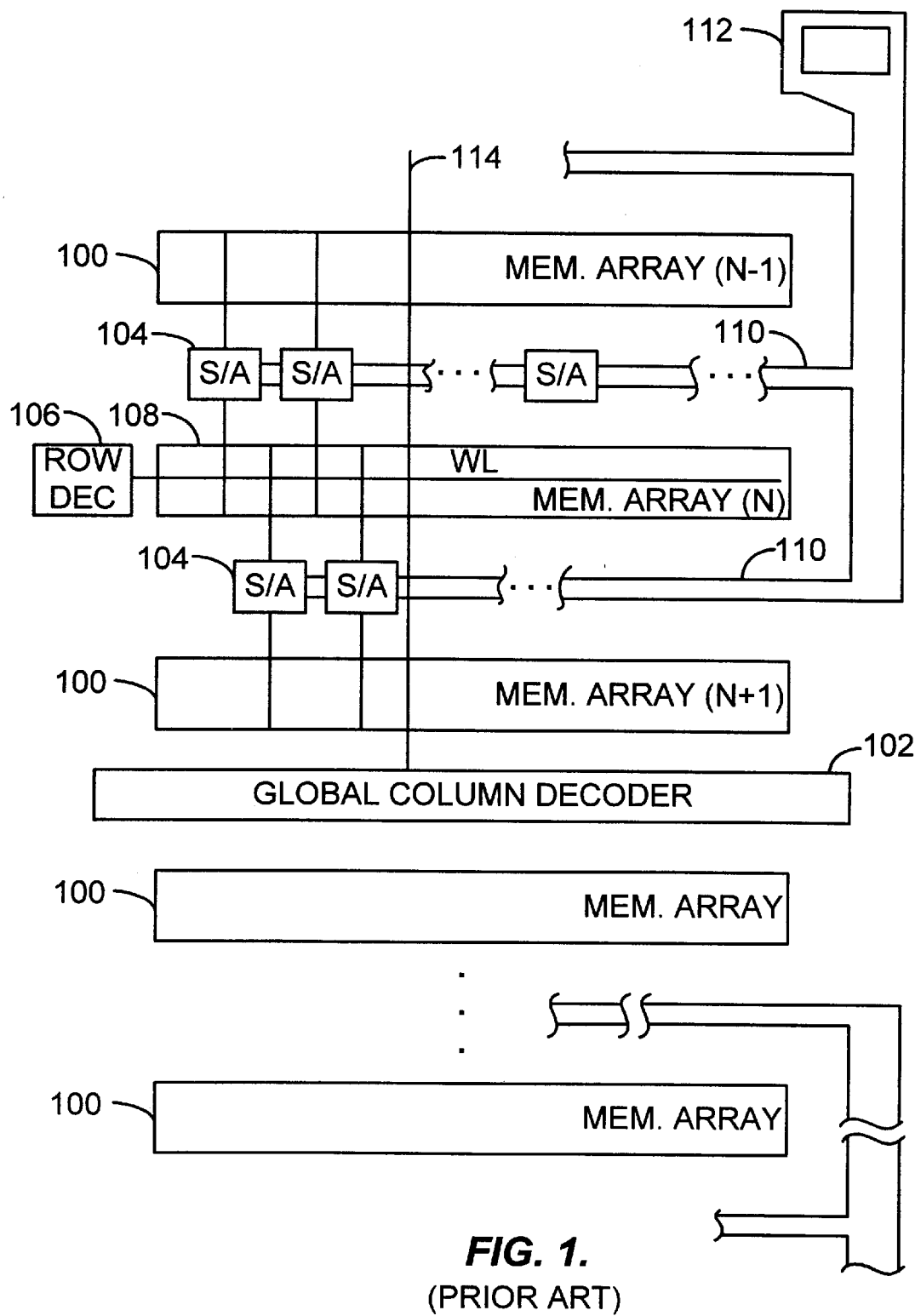
FIG. 1 depicts a block diagram of a simplified example of a random access memory of the prior art.
Figure 2:
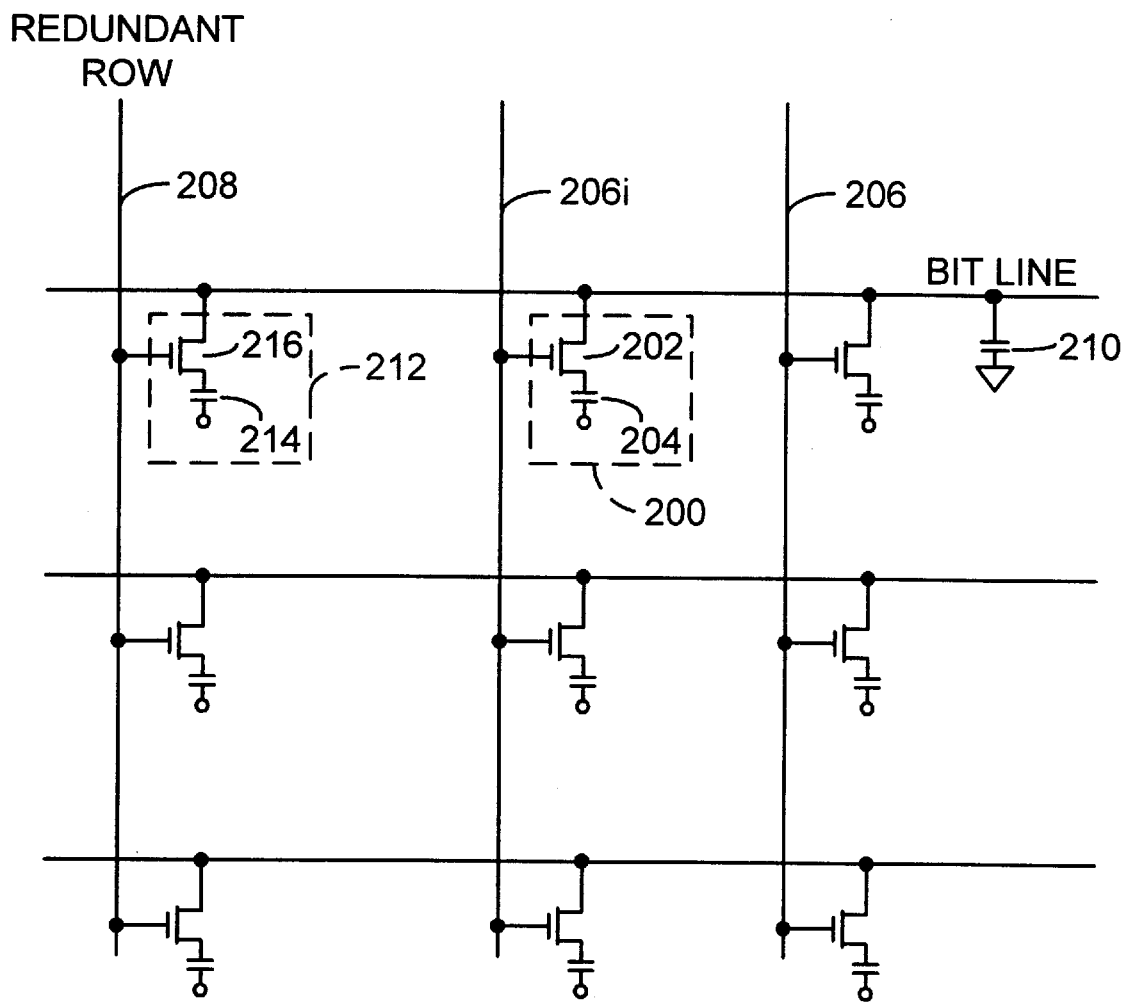
FIG. 2 depicts a schematic diagram of a typical array of memory cells for a DRAM.
Figure 3:
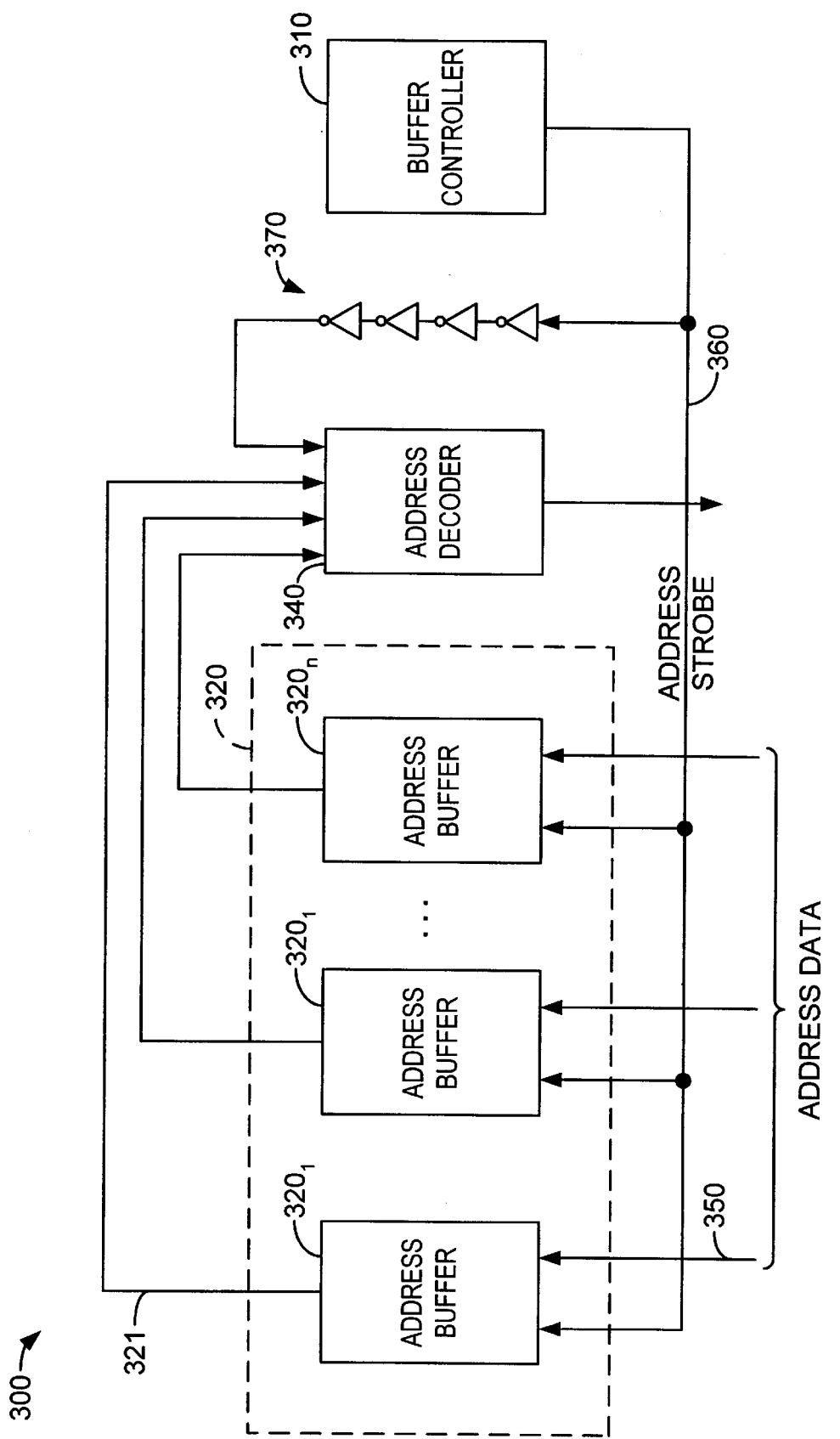
FIG. 3 depicts a block diagram of a decoding apparatus according to the prior art.
Figure 4:
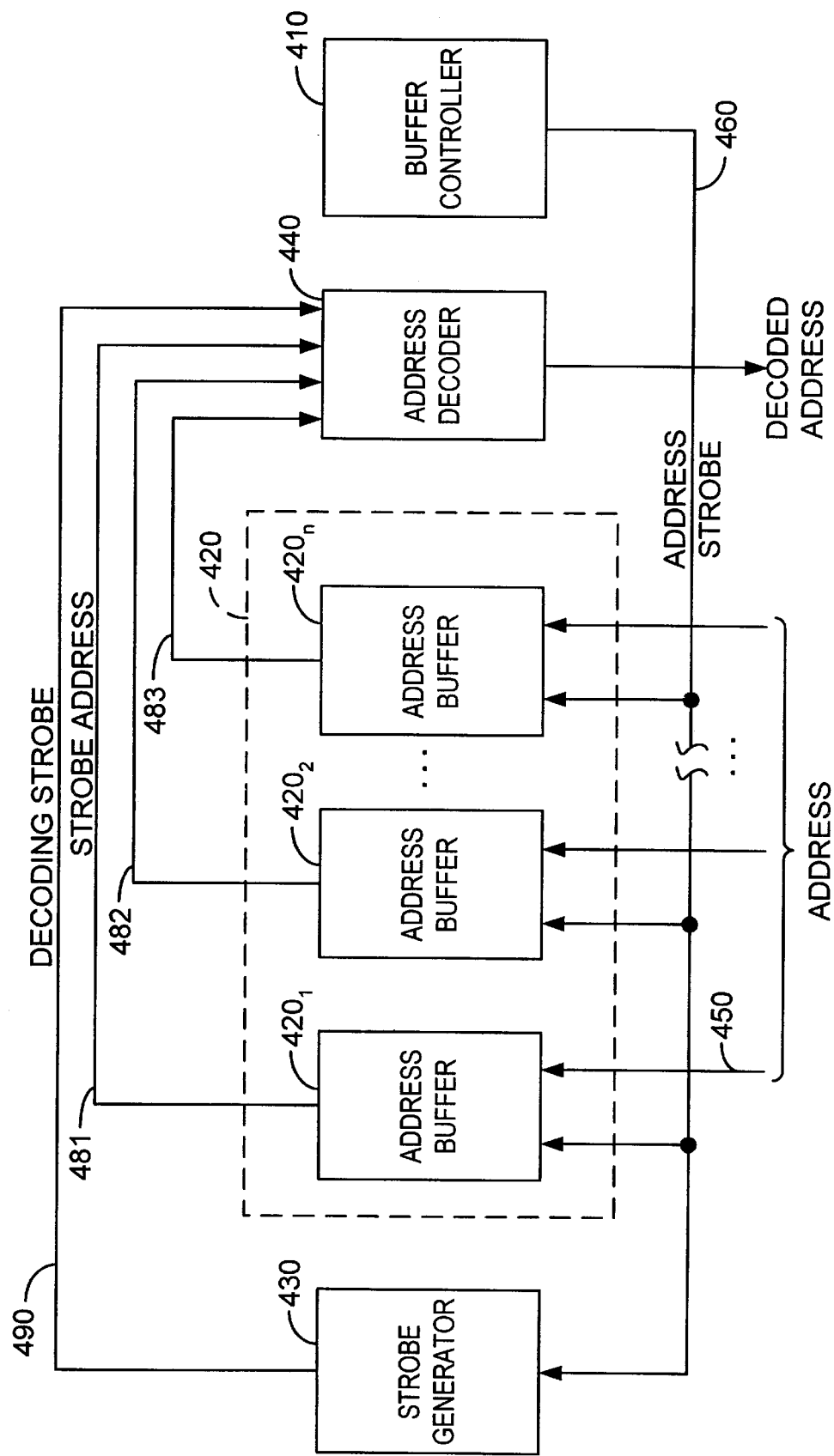
FIG. 4 depicts a block diagram of an address decoding apparatus according to an embodiment of the present invention.

FIG. 4 shows a decoding apparatus according to an embodiment of the present invention. The apparatus 400 generally contains a buffer array 420 having a plurality of address buffers $420_1$–$420_n$ coupled to an address decoder 440 and a buffer controller 410 coupled to the address buffers $420_1$–$420_n$ by a signal line 460. Apparatus 400 also includes a strobe generator 430 that is coupled to buffer controller 410, e.g. by signal line 460. An output of strobe generator 430 is further coupled to address decoder 440. Buffers in array 420 receive an address signal via address lines 450. The input address is strobed into buffers $420_1$–$420_n$ by the address strobe signal on line 460. Once strobe generator 430 receives the address strobe signal, strobe generator 430 sends a decoding strobe to address decoder 440. The decoding strobe signals address decoder 440 to decode the strobed address from address buffers $420_1$–$420_n$. There is normally an inherent delay in the operation of each of address buffers $420_1$–$420_n$ such that the each buffer sends its bit of the strobed address slightly after the buffer receives the address strobe. There can be considerable variability in the amount of delay from wafer to wafer within a given lot of wafers, or even from die to die within a given wafer. However, if the address buffers are substantially all of the same design, there can be considerable uniformity in the amount of delay among address buffers that are in the same array and on the same die. In other words, address buffers can have substantially the same operating margin because of their proximity during manufacture. If strobe generator 430 is substantially equivalent to address buffers $420_1$–$420_n$, and in sufficient proximity to address buffer array 420, strobe generator 430 can have substantially the same inherent delay and operating margin as address buffers $420_1$–$420_n$.

In an embodiment of the present invention, strobe generator 430 has an inherent delay substantially equivalent to the inherent delays of address buffers $420_1$–$420_n$. If, for example, the address strobe signal arrives at strobe generator 430 and address buffers $420_1$–$420_n$ simultaneously, address and decoding strobe will arrive at address decoder 440 at approximately the same time. To ensure proper address decoding, it may be preferable that the address strobe signal arrive slightly later than the last bit of the strobed address. To properly time the arrival of the decoding strobe, apparatus 400 is configured such that the address strobe signal arrives at strobe generator 430 slightly later than it arrives at any of address buffers in array 420. Thus, if address strobe 430 and address buffers $420_1$–$420_n$ have approximately the same inherent delay, and the address strobe signal arrives at strobe generator 430 last, then the strobe generator will send the decoding strobe to address decoder 440 after address buffers $420_1$–$420_n$ have sent their respective address bits to address decoder 440. Thus, if the signal path for the decoding strobe is substantially equivalent to the longest signal path for the address signals, the decoding strobe will arrive at address decoder 440 after all the data bits from address buffer array 420 arrive at address decoder 440. Address buffers $420_1$–$420_n$ send their respective bits of the strobed address to address decoder 440 via strobed address signal lines 481, 482 and 483. The longest delay in transmitting the strobed address is in a longest strobed address signal line, e.g., address strobe signal line 481 connecting address buffer 421 and address decoder 440. To ensure that the decoding strobe arrives last, strobe generator 430 may be connected to address decoder 440 by a decoding strobe signal line 490 that is longer than longest address strobe signal line 481.

In a preferred embodiment, strobe generator 430 is located adjacent an outermost address buffer $420_1$ in buffer array 420 at an end of signal line 460. Since the address strobe signal must travel a longer distance to strobe generator 430 than to any of the address buffers, the address strobe signal takes a longer time to travel to strobe generator 430. Thus, the address strobe signal arrives at strobe generator 430 last, i.e. after all of the buffers in array 420 have received the address strobe signal. If strobe generator 430 receives the address strobe last and strobe generator 430 has an inherent delay comparable to an inherent delay of address buffers $420_1$–$420_n$, then strobe generator 430 sends the decoding strobe to address decoder 440 after address buffers $420_1$–$420_n$ have sent their respective address bits to address decoder 440. In other words, the decoding strobe signal sent by strobe generator 430 determines the timing margin of address decoder 440.

III Exemplary Decoding Method

Figure 5:
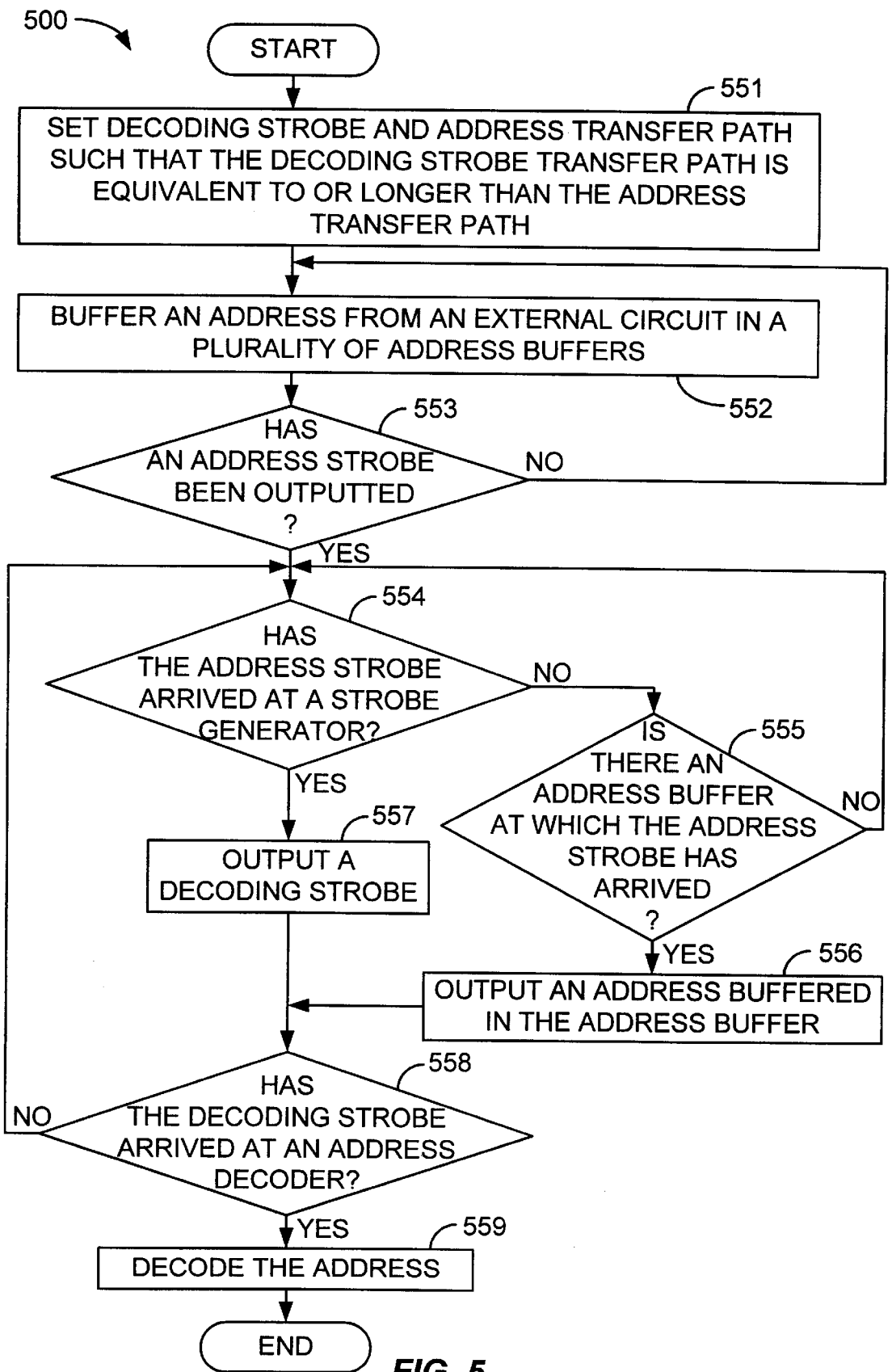
FIG. 5 depicts a flow chart of an embodiment of a method for decoding address signals according to the present invention

FIG. 5 depicts a flow chart illustrating operation of a memory device according to an embodiment of the method of the present invention. By way of example, the memory device employs a decoding apparatus of the type depicted in FIG. 4. The method 500 begins at 551 by setting the strobe transfer path equivalent to or longer than the address transfer path. At 552 a plurality of address buffers such as buffers $420_1$–$420_n$ of FIG. 4, buffer an address signal from an external circuit. If, at 553, buffer controller 410 has produced an address strobe and, at 554, the address strobe has arrived at strobe generator 430, strobe generator 430 outputs a decoding strobe at 557. If, at 554, buffer controller 410 has sent an address strobe but strobe generator 410 has not received it, address buffers $420_1$–$420_n$ that have received the address strobe at 555 may output their respective bits of an address to address decoder 440 at 556. Once the decoding strobe arrives at address decoder 440 at 558, address decoder 440 decodes the address. Another address may then be buffered at 552 and the above method repeated for any number of addresses.

IV Exemplary Circuits

Figure 6:
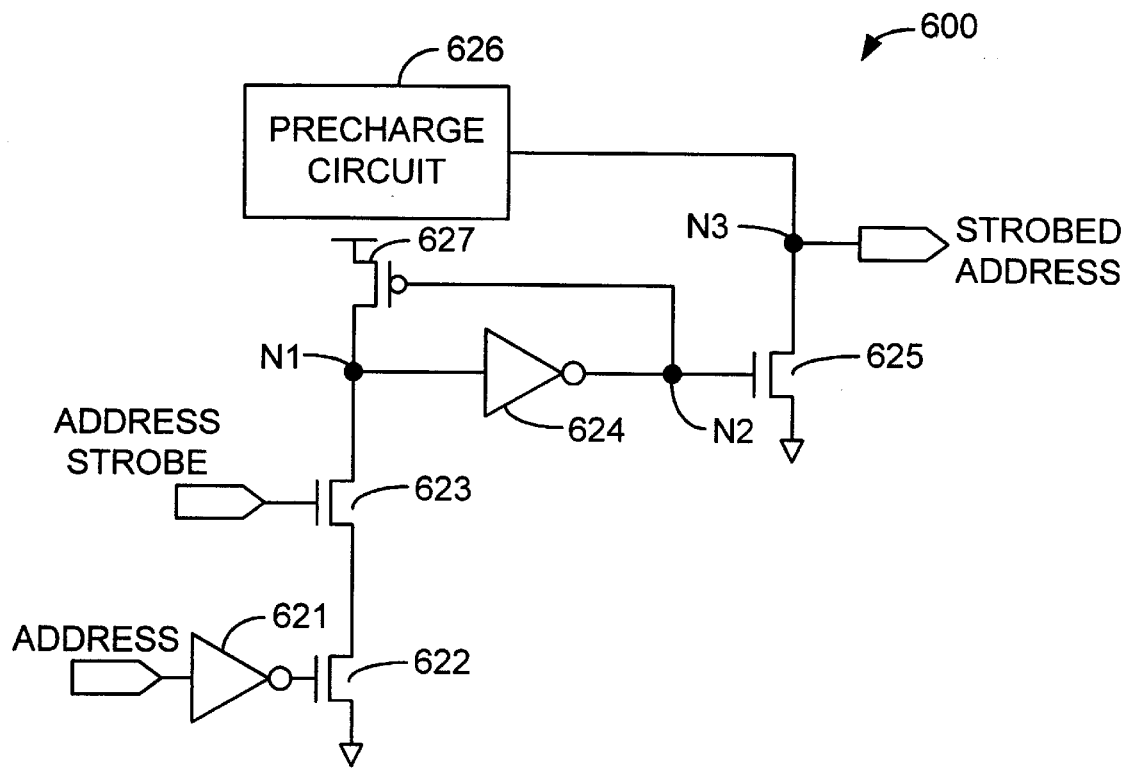
FIG. 6 depicts a schematic diagram of an address buffer circuit used in the decoding apparatus of FIG. 4.
Figure 7:
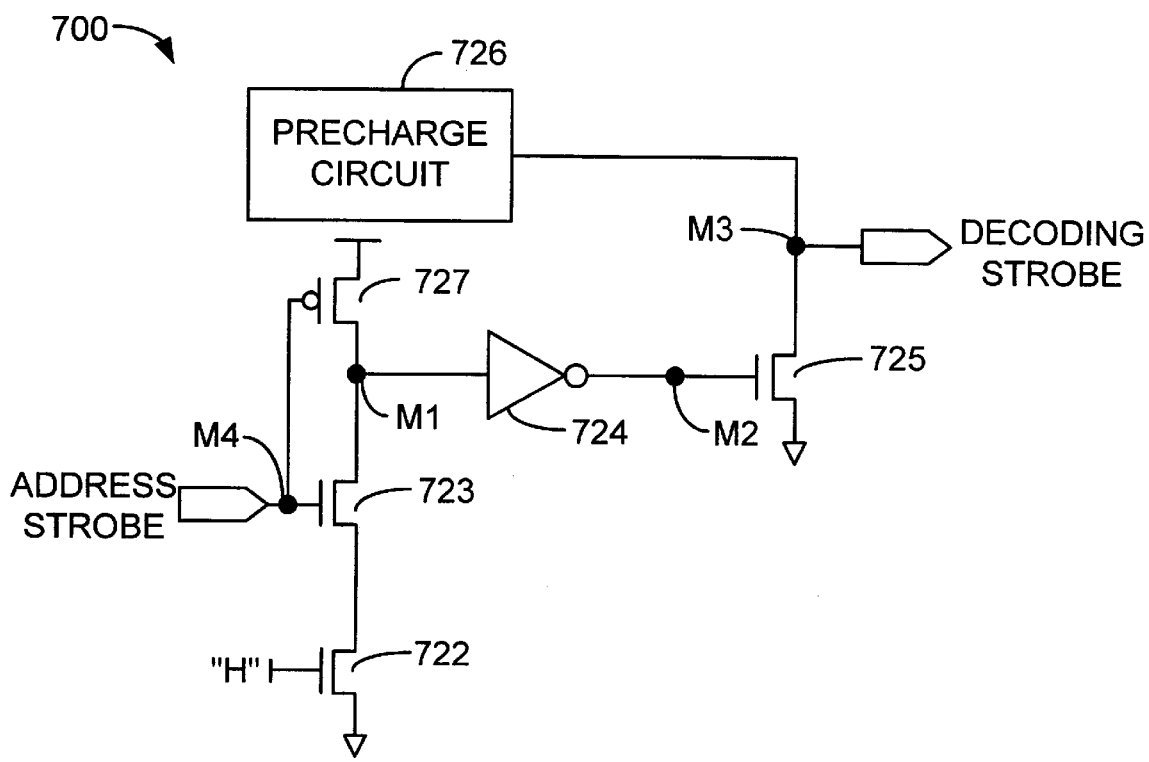
FIG. 7 depicts a schematic diagram of a decoding signal generator circuit used in the decoding apparatus of FIG. 4.

The inherent delays of elements such as address buffers and strobe generator of FIG. 4 depend on design of the circuits that implement these elements. One way to match the inherent delays of the strobe generator with the inherent delays of the address buffers is depicted in FIG. 6 and FIG. 7 FIG. 6 depicts an address buffer circuit according to an embodiment of the present invention. FIG. 7 depicts a strobe generator that is substantially equivalent to the address buffer of FIG. 6. The two circuits have similar construction and many common components.

FIG. 6 depicts an address buffer circuit 600 that generally comprises NMOS transistors 622, 623, 625, inverters 621, 624, a precharge circuit 626, and a PMOS transistor 627. An input of inverter 621 is configured to receive a bit of an address from an external circuit. An output terminal of inverter 621 is coupled to a gate of transistor 622. A source of transistor 622 is coupled to a ground voltage. The term "ground voltage" herein generically refers to a common base voltage of a circuit. A drain of transistor 622 is coupled to a source of transistor 623. Transistor 623 has a gate coupled to an output terminal of a control signal generator, such as buffer controller 410 of FIG. 4. An input of inverter 624 is coupled to a drain of transistor 623 at a node N1. An output of inverter 624 is coupled to a drain of PMOS transistor 627 at node N2. A source of PMOS transistor 627 is coupled to a source voltage and a gate of PMOS transistor 627 is coupled to the output of inverter 624 at node N1. The output of inverter 624 is also coupled to a gate of NMOS transistor 625. NMOS transistor 625 has a drain coupled to precharge circuit 626 at a node N3 and a source coupled to ground. The voltage at node N3 determines the logical value of a bit the strobed address. Node N3 may therefore be coupled to an address decoder such as address decoder 440 of FIG. 4.

The logical values at nodes N1 and N2 determine the logical value of the bit of the strobed address provided at N3. In an exemplary embodiment, transistor 625 is normally off and N3 is normally kept "high" by the operation of precharge circuit 626. To keep transistor 625 off, the output of inverter 624 is kept "low". A low output from inverter 624 turns PMOS transistor 627 "on". If transistor 627 is on, the input of inverter 624 is "high". Thus, inverter 624 and PMOS transistor hold node N1 high as long as transistors 622 and 623 are off. Node N1 is pulled low to change N2 to high and pull the strobed address bit at N3 low. To pull the input of inverter 624 low, transistors 622 and 623 are turned on. A "high" voltage applied to the gates of NMOS transistors 622 and 623 turns them on. Inverter 621 applies a "high" voltage to the gate of NMOS transistor 622 if the address bit from the external circuit is a "low". As long as the address strobe is "low", the strobed address at N3 is "high", independent of the value of the address bit. If the address bit from the external circuit is "high" and the address strobe is also high, transistor 623 turns on but not transistor 622 so the strobed address is a "high". If the address bit from the external circuit is "low" and the address strobe is also high, both transistors 622 and 623 turn on pulling N1, i.e., the input of inverter 624 low, producing a "high" at N2, which turns on transistor 625 and pulls the strobed address "low" at N3.

Table I summarizes the operation of the address buffer circuit of FIG. 6.

TABLE I

| Address | Address strobe | N1 | N2 | N3 |
|---------|----------------|----|----|----|
| H | L | H | L | H |
| H | H | H | L | H |
| L | L | H | L | H |
| L | H | L | H | L |

FIG. 7 depicts a strobe generator circuit 700 that replicates address buffer circuit 600. Strobe generator 700 generally comprises NMOS transistors 722, 723, 725, an inverter 724, a precharge circuit 726, and a PMOS transistor 727. Precharge circuit 726 may be the same precharge circuit 626 of FIG. 6. Strobe generator 700 is configured much like address buffer 600. However, unlike address buffer 600, wherein inverter 621 is coupled to the gate of NMOS transistor 622, a gate of transistor 722 is coupled to a "high voltage". Although transistor 722 may seem superfluous it introduces an inherent delay corresponding the inherent delay of transistor 622 in address buffer circuit 600. Thus the delays of address buffer circuit 600 and strobe generator 700 may be closely matched by matching the components of their respective circuitry.

The rest of strobe generator circuit 700 has several features in common with address buffer circuit 600. A source of transistor 722 is coupled to a ground voltage. A drain of transistor 722 is coupled to a source of transistor 723. A gate of transistor 723 receives an address strobe. The gate of transistor 723 may be coupled to an output terminal of control signal generator, such as buffer controller 410 of FIG. 4. An input of inverter 724 is coupled to a drain of transistor 723 at a node M1. An output of inverter 724 is coupled to a gate of NMOS transistor 725 at node M2. NMOS transistor 725 has a drain coupled to precharge circuit 726 at a node M3 and a source coupled to a ground voltage. PMOS transistor 727 has a source coupled to a source voltage and a gate coupled to a gate of NMOS transistor 723 at node M4.

The voltage at node M3 determines the logical value of the decoding strobe. Node M3 may therefore be coupled to an address decoder such as address decoder 440 of FIG. 4. The logical values at nodes M1, M2 and M4 determine the logical value of the decoding strobe provided at M3 in a manner analogous to that described with respect to the value of node N3 in FIG. 6. In an exemplary embodiment, transistor 725 is normally off and M3, i.e., the decoder strobe, is normally kept "high" by a voltage supplied by precharge circuit 726. PMOS transistor 727 keeps the input of inverter 724 "low" so the output of inverter 724 is "high" keeping transistor 725 off until the input of inverter 724 is pulled "low". The input of inverter 724 is pulled low when NMOS transistors 722 and 723 are turned "on" and PMOS transistor 727 is turned "off". Since the gate of NMOS transistor 722 is coupled to a "high" voltage, transistor 722 is usually on all the time. In the circuit of FIG. 7, a "high address strobe at M4 turns PMOS transistor 727 "off" and turns NMOS transistor 723 "on". If the address strobe at M3 is "high", transistor 723 turns on pulling M1, i.e., the input of inverter 724, low, producing a "high" at M2, which turns on transistor 725, which pulls the decoding strobe "low" at M3.

Table II summarize the operation of the strobe generator circuit of FIG. 7.

TABLE II

| Address | Address strobe (M4) | M1 | M2 | M3 |
|---------|---------------------|----|----|-----|
| N/A | L | H | L | H |
| N/A | H | L | H | L |

Although specific embodiments have been described for the address buffer and strobe generator circuits, it is a matter of routine skill in the art to devise circuits having different configurations. For example the strobed address at N3 in FIG. 6 is normally "high". By suitable modification, address buffer circuit 600 may be configured such that the strobed address at N3 is normally "low". Furthermore, although the circuits of FIGS. 6 and 7 are described as having complimentary-metal-oxide-semiconductor (CMOS) transistors, these circuits may alternatively be implemented with other types of transistors such as junction, silicon-on-insulator (SOI), bipolar, field effect (FET), Gallium Arsenide (GaAs) transistors and the like.

Embodiments of the apparatus and method of the present invention provide for optimal decoding of address signals. Since strobe generator does not send a decoding strobe until the last address buffer has received an address strobe, optimized timing of the decoding is ensured, independent of the inherent delays of the address buffers and strobe generator. Embodiments for the apparatus and method of the present invention may be employed in a memory device such as a random access memory (RAM), dynamic random access memory (DRAM), or synchronous dynamic random access memory (SDRAM). While the above is a complete description of specific embodiments of the present invention, various modifications, variations, and alternatives may be employed. The scope of this invention, therefore, should not be limited to the embodiments described, and should instead be defined by the following claims.

What is claimed is:

1. An apparatus for decoding address signals, comprising:
   an address buffer array configured to buffer address signals, in response to a first control signal;
   a first control signal generator coupled to the address buffer array configured to generate the first control signal;
   an address decoder coupled to the address buffers array configured to decode the buffered address signals, in response to a second control signal; and
   a second control signal generator coupled to the array of address buffers and to the first control signal generator, the second control signal generator configured to generate the second control signal, in response to the first control signal,
   wherein the second control signal generator is designed to exhibit substantially the same delay as an address buffer of the address buffer array.

2. The apparatus of claim 1, wherein the second control signal generator is coupled to the first control signal generator by a signal path that is longer than a longest signal path connecting one of the address buffers with the first control signal generator.

3. The apparatus of claim 1 wherein the second control signal generator is configured to have a longer signal transfer delay than any address buffer in the address buffer array.

4. The apparatus of claim 3, wherein the second control signal generator is coupled to the first control signal generator by a signal path, the signal path is longer than a longest signal path connecting one of the address buffers with the first control signal generator.

5. The apparatus of claim 1, wherein the second control signal generator comprises:
   a circuit substantially equivalent to each address buffer in the address buffer array; and
   input and output lines connected to the circuit, the input and output lines being substantially equivalent to input and output lines connected to an outmost address buffer,
   wherein the second signal generator is located at a position adjacent to the outmost address buffer.

6. The apparatus of claim 5, wherein each address buffer comprises:
   a first inverter for configured to receive the address signal from an external circuit;
   a first transistor having a gate coupled to an output terminal of the first inverter and a source coupled to a ground voltage;
   a second transistor having a gate coupled to an output terminal of the first control signal generator and a source coupled to a drain of the first transistor;
   a second inverter coupled to a drain of the second transistor; and
   a third transistor having a gate coupled to an output terminal of the second inverter, a source coupled to the ground voltage level, and a drain coupled to the address decoder.

7. The apparatus of claim 1, wherein the second control signal generator comprises:
   a fourth transistor having a gate configured to receive a high level signal and a source coupled to a ground voltage level;
   a fifth transistor having a gate coupled to an output terminal of the first control signal generator and a source coupled to a drain of the fourth transistor;
   a third inverter coupled to a drain of the fifth transistor; and
   a sixth transistor having a gate coupled to an output terminal of the third inverter and a drain coupled to the address decoder.

8. An apparatus for decoding signals, comprising:
   a buffer array configured to buffer signals, in response to a first control signal;
   a first control signal generator coupled to the buffer array configured to generate the first control signal;
   a decoder coupled to the array of buffers configured to decode the buffered signals, in response to a second control signal;
   a second control signal generator coupled to the array of buffers and to the first control signal generator, the second control signal generator configured to generate the second control signal in response to the first control signal.

9. The apparatus of claim 8 wherein the second control signal generator has one or more signal transfer characteristics in common with one or more buffers in the buffer array.

10. The apparatus of claim 8 wherein the second control signal generator has a longer signal transfer delay than any signal transfer delay of any buffer in the buffer array.

11. The apparatus of claim 10, wherein the second control signal generator is connected to the first control signal generator by a signal path that is longer than a longest signal path connecting one of the buffers with the first control signal generator.

12. The apparatus of claim 8, wherein the second control signal generator comprises:
- a circuit substantially equivalent to each buffer in the buffer array; and
- input and output lines connected to the circuit, the input and output lines being substantially equivalent to input and output lines connected to an outmost buffer,
- wherein the second control signal generator is located at a position adjacent to the outmost buffer.

13. The apparatus of claim 12, wherein each buffer comprises:
- a first inverter configured to receive an address signal from an external circuit;
- a first transistor having a gate coupled to an output terminal of the first inverter and a source coupled to a ground voltage;
- a second transistor having a gate coupled to an output terminal of the first control signal generator and a source coupled to a drain of the first transistor;
- a second inverter coupled to a drain of the second transistor; and
- a third transistor having a gate coupled to an output terminal of the second inverter, a source coupled to the ground voltage level, and a drain coupled to the decoder.

14. The apparatus of claim 8, wherein the second control signal generator comprises:
- a fourth transistor having a gate configured to receive a high level signal and a source coupled to a ground voltage level;
- a fifth transistor having a gate coupled to an output terminal of the first control signal generator and a source coupled to a drain of the fourth transistor;
- a third inverter coupled to a drain of the fifth transistor; and
- a sixth transistor having a gate coupled to an output terminal of the third inverter and a drain coupled to the decoder.

15. A method for decoding address signals, the method comprising:
- buffering the address signals in an address buffer array, in response to a first control signal;
- generating a first control signal from a first control signal generator that is coupled to the buffer array;
- generating a second control signal from a second control signal generator by delaying the first control signal using signal transferring characteristics of the address buffer, so that the second control signal determines an input timing margin of an address decoder; and
- decoding the buffered address signals via the address decoder, in response to the second control signal.

16. The method of claim 15, wherein the second control signal generator is adjacent to an outmost address buffer in the address buffer array.

17. The method of claim 16, wherein the outmost address buffer has the longest signal transferring line to the address decoder.

18. The method of claim 17 wherein the control signal generator has the transfer delay characteristics substantially equivalent to the outmost address buffer.

19. A method for decoding signals, comprising the steps of:
- buffering signals in a buffer array, in response to a first control signal;
- generating a second control signal by delaying the first control signal using signal transferring characteristics of the buffer array, so that the second control signal determines an input timing margin of a decoding means; and
- decoding the buffered signals, in response to the second control signal.

20. The method of claim 19, wherein the second control signal is generated by control signal generating means located adjacent to an outermost buffer in the buffer array.

21. The method of claim 19, wherein the delay depends upon a signal path length between a control signal generating means and a decoding means.

22. The method of claim 21 wherein the control signal generating means has transfer delay characteristics substantially equivalent to an outmost buffer.

* * * * *